US010209796B2

(12) United States Patent
Lim et al.

(10) Patent No.: US 10,209,796 B2
(45) Date of Patent: Feb. 19, 2019

(54) DISPLAY ASSEMBLY CONNECTOR DEVICE

(71) Applicant: GOOGLE LLC, Mountain View, CA (US)

(72) Inventors: David Kyungtag Lim, Glenview, IL (US); Paul Lynn Fordham, Wauconda, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/424,490

(22) Filed: Feb. 3, 2017

(65) Prior Publication Data

US 2018/0224957 A1    Aug. 9, 2018

(51) Int. Cl.
| | | |
|---|---|---|
| G06F 3/041 | (2006.01) | |
| G02F 1/1345 | (2006.01) | |
| H05K 1/02 | (2006.01) | |
| H05K 1/18 | (2006.01) | |
| G06F 1/16 | (2006.01) | |
| H05K 1/14 | (2006.01) | |
| H05K 5/00 | (2006.01) | |

(52) U.S. Cl.
CPC .......... *G06F 3/041* (2013.01); *G02F 1/13452* (2013.01); *G06F 1/1616* (2013.01); *H05K 1/028* (2013.01); *H05K 1/14* (2013.01); *H05K 1/18* (2013.01); *H05K 5/0017* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 5,384,690 | A | 1/1995 | David et al. |
| 8,797,748 | B2 * | 8/2014 | Dabov ................. G06F 1/1613 |
| | | | 254/250 |
| 9,772,729 | B2 * | 9/2017 | Bolender ............... G06F 3/044 |
| 2006/0050492 | A1 | 3/2006 | Goodwin et al. |
| 2010/0062656 | A1 | 3/2010 | Lynch et al. |
| 2010/0091451 | A1 | 4/2010 | Hendren et al. |
| 2012/0044637 | A1 | 2/2012 | Rothkopf et al. |
| 2013/0258575 | A1 | 10/2013 | Rothkopf et al. |
| 2014/0092034 | A1 | 4/2014 | Franklin et al. |

(Continued)

FOREIGN PATENT DOCUMENTS

| | | |
|---|---|---|
| CN | 202948424 U | 5/2013 |
| EP | 1651015 | 4/2006 |

(Continued)

OTHER PUBLICATIONS

International Search Report and Written Opinion issued in International Application No. PCT/US2014/055776, dated Jan. 4, 2018, 17 pages.

(Continued)

*Primary Examiner* — Duane N Taylor, Jr.
(74) *Attorney, Agent, or Firm* — Fish & Richardson P.C.

(57) ABSTRACT

An electronic device including a display assembly is provided. In some embodiments, the electronic device includes a flex conductor electrically connecting a display integrated circuit and a circuit board. The flex conductor may have a display end including first and second connectors separated by a space and a circuit board connector end including a third connector opposite from the display connector end.

18 Claims, 5 Drawing Sheets

(56) References Cited

U.S. PATENT DOCUMENTS

| | | | |
|---|---|---|---|
| 2014/0170907 A1 | 6/2014 | Golko et al. | |
| 2014/0184057 A1 | 7/2014 | Kim et al. | |
| 2014/0218639 A1 | 8/2014 | Lin et al. | |
| 2014/0225131 A1* | 8/2014 | Benson | G06F 1/1643 257/82 |
| 2015/0162684 A1 | 6/2015 | Amini et al. | |
| 2015/0305138 A1 | 10/2015 | Tombs et al. | |
| 2016/0147323 A1* | 5/2016 | Chiang | G06F 3/041 345/173 |
| 2016/0188059 A1* | 6/2016 | Lee | G06F 3/0412 345/173 |
| 2016/0205766 A1 | 7/2016 | Blum et al. | |

FOREIGN PATENT DOCUMENTS

| | | |
|---|---|---|
| EP | 3068198 | 9/2016 |
| JP | 2005302543 A | 10/2005 |

OTHER PUBLICATIONS

'www.padpcb.com' [online] "Flexible Printed Curcuit Manufacturing," 2017 [Retrieved on Feb. 3, 2017] Retrieved from Internet URL<http://www.padpcb.com/flexbile-printed-circuit-manufacturing_p41.html> 4 pages.

'www.szsmtfly.com' [online] "Temperature Resist Acf Tapes For Pulse Heat Bonding Machine LCD," 2016-2017 copyright, [retrieved on Feb. 3, 2017] Retrieved from Internet URL<http://www.szsmtfly.com/sale-8234891-temperature-resist-acf-tapes-for-pulse-heat-bonding-machine-lcd.html> 3 pages.

'www.chipworks.com' [online] "Inside the Samasung Galaxy S6," Apr. 2, 2015 [retrieved on Feb. 3, 2017] Retrieved from Internet URL<https://www.chipworks.com/about-chipworks/overview/blog/inside-the-samsung-galaxy-s6> 10 pages.

'www.techinsights.com' [online] "Apple iPhone 7 Teardown," [Retrieved on Feb. 3, 2017} Retrieved from Internet: URLhttp://www.techinsights.com/about-techinsights/overview/blog/apple-iphone-7-teardown/> 24 pages.

'www.fonearena.com' [online] "OnePlus 3 Teardown," [retrieved Feb. 3, 2017] Retrieved from Internet: URL<http://www.fonearena.com/blog/189275/oneplus-3-teardown.html> 14 pages.

'eandt.theiet.org' [online] "Huawei P9 smartphone: tech spec and teardown," Oct. 7, 2016, [retrieved on Feb. 3, 2017] Retrieved from Internet: URL<https://eandt.theiet.org/content/articles/2016/09/huawei-p9-smartphone-tech-spec-and-teardown/> 8 pages.

'www.androidauthority.com' [online] LG g4 Teardown, Jun. 8, 2015, [retrieved on Feb. 3, 2017] Retrieved from Internet: URL<http://www.androidauthority.com/lg-g4-teardown-614759/> 3 pages.

'www.ifixit.com' [online] "Motorola Moto X Teardown," Aug. 23, 2013, [retrieved on Feb. 2, 2017] Retrieved from Internet URL<https://www.ifixit.com/Teardown/Motorola+Moto+X+Teardown/16867> 15 pages.

'www.ifixit.com' [online] Samsung Galaxy S7 Teardown, Mar. 8, 2016, [retrieved on Feb. 3, 2017] Retrieved from Internet: URL<https://www.ifixit.com/Teardown/Samsung+Galaxy+S7+Teardown/56686> 17 pages.

'www.ifixit.com' [online] "iPhone 7 Plus Teardown," Sep. 15, 2016, [retrieved on Feb. 3, 2017] Retrieved from Internet: URL<https://www.ifixit.com/Teardown/iPhone+7+Plus+Teardown/67384> 30 pages.

'www.ifixit.com' [online] "Google Pixel XL Teardown," Oct. 21, 2016 [retrieved on Feb. 2, 2017] Retrieved from Internet: URL<https://www.ifixit.com/Teardown/Google+Pixel+XL+Teardown/71237> 14 pages.

Written Opinion issued in International Application No. PCT/US2017055776, dated Nov. 20, 2011, 8 pages.

* cited by examiner

DISPLAY ASSEMBLY CONNECTOR DEVICE

BACKGROUND

Electronic devices having user interface displays are well known. User interface displays may be driven by driver circuitry that controls the display output and receives user input, such as touch input received by a touch display. Various types of electrical connections allow data and power to transfer between the user interface display and a processor or other components of the electronic device. Typical connectors have a first end that connects to an integrated circuit of the display assembly and a second end that connects to a printed circuit board of the device. The connector may be positioned between one or more other components of the electronic device in order to provide an electrical connection between the display assembly and the circuit board.

SUMMARY

In general, this document describes devices, systems, and methods for electrical connection between electronic components of an electronic device, such as between a display assembly and a circuit board. Some example electronic devices include a display assembly having a display integrated circuit and a circuit board including a processor and/or other electronic components. First and second connectors at a first end of an electrical conductor may be connected to the display assembly, and a third connector may be connected to the circuit board. An electrical conductor having first and second connectors electrically connected to the display assembly may promote a compact, space-efficient configuration, and facilitate flexibility in arranging components within the electronic device. The overall size of the electronic device may accordingly be reduced, or additional or larger components may be accommodated within the electronic device.

As additional description to the embodiments described below, the present disclosure describes the following embodiments.

Embodiment 1 is a touch display system, comprising: a display substrate having a front major face and a back major face; a display integrated circuit mounted to the display substrate; a circuit board including a processor oriented behind the back major face of the display substrate; and a flex conductor electrically connected to the display integrated circuit and the circuit board, the flex conductor having: (i) a display connector end including a first connector and a second connector, the first connector and the second connector being separated by a distance defining a space, and (ii) a circuit board connector end including a third connector opposite from the display connector end, wherein the first connector and the second connectors are connected to the display integrated circuit and the third connector is connected to the circuit board.

Embodiment 2 is the system of embodiment 1, wherein the display substrate defines a central, longitudinal axis passing parallel to the front and back major faces, and the central, longitudinal axis intersects the display integrated circuit.

Embodiment 3 is the system of embodiment 2, wherein the central, longitudinal axis does not intersect the flex conductor at the connection with the display integrated circuit.

Embodiment 4 is the system of any of the preceding embodiments, wherein the display integrated circuit is centered about the central, longitudinal axis.

Embodiment 5 is the system of any of the preceding embodiments, wherein the first connector and the second connector are positioned symmetrically about the central, longitudinal axis.

Embodiment 6 is the system of any of the preceding embodiments, wherein the display end of the flex conductor has a width (W), and the distance defining the space is between 0.2*width (W) and 0.8*width (W).

Embodiment 7 is the system of any of the preceding embodiments, wherein an electrical component that is not directly electrically connected to the flex conductor is accommodated between the first connector and the second connector.

Embodiment 8 is the system of any of the preceding embodiments, wherein a connector receptacle is accommodated in the space between the first connector and the second connector.

Embodiment 9 is the system of any of the preceding embodiments, wherein a component selected from the group consisting of a microphone, speaker, sensors, fingerprint sensor, proximity sensor, accelerometer, camera, flash device, and processor is located between the first connector and the second connector.

Embodiment 10 is the system of any of the preceding embodiments, wherein the display integrated circuit is mounted to the front major face of the display substrate and the flex conductor wraps around the display substrate from the front major face to the back major face.

Embodiment 11 is the system of any of the preceding embodiments, wherein the circuit board is a printed circuit board.

Embodiment 12 is the system of any of the preceding embodiments, wherein the circuit board is a flexible circuit.

Embodiment 13 is a touch display system, comprising: a display substrate having a front major face and a back major face; a circuit board including a processor oriented behind and parallel to the back major face of the display substrate; a flex conductor electrically connecting the display substrate and the circuit board, the flex conductor having a display end including a first connector and a second connector separated by a distance defining a space and a circuit board connector end including a third connector opposite from the display connector end; and a display integrated circuit mounted on the flex conductor; wherein the first and second connectors are electrically connected with the display substrate and the third connector is electrically connected with the circuit board.

Embodiment 14 is the system of embodiment 13, wherein the display substrate defines a central, longitudinal axis passing parallel to the front and back major faces, and the central, longitudinal axis intersects the display integrated circuit.

Embodiment 15 is the system of embodiment 13 or 14, wherein the central, longitudinal axis does not intersect the flex conductor at the connection with the display substrate.

Embodiment 16 is the system of any of embodiments 13-15, wherein the display end of the flex conductor has a width (W), and the distance defining the space is between 0.2*width (W) and 0.6*width (W).

Embodiment 17 is the system of any of embodiments 13-16, wherein an electrical component that is not directly electrically connected to the flex conductor is accommodated between the first connector and the second connector.

Embodiment 18 is the system of any of embodiments 13-17, wherein a connector receptacle is located between the first connector and the second connector.

Embodiment 19 is a method of manufacturing a display assembly, comprising: connecting a first connector and a second connector of a flex conductor with a display assembly, the first and second connectors separated by a distance defining a space and positioned at an opposite end of the flex conductor from a third connector; connecting the third connector to a circuit board; and enclosing the flex conductor and circuit board within a housing of an electronic device.

Embodiment 20 is the method of embodiment 19, wherein the step of connecting the first and second connectors to the display assembly includes connecting the first and second connectors to a display integrated circuit.

These and other embodiments described herein may provide one or more of the following benefits. First, some configurations described herein allow an electronic device to be smaller. A split connector end electrically connected to a display assembly may reduce a length of the electronic device by facilitating positioning of other components alongside or between the connector ends.

Second, various connectors described herein can provide flexibility in arranging other components within the electronic device. For example, a split connector end can facilitate positioning of other components centrally (e.g., along a central longitudinal axis of the electronic device) without significantly increasing the overall dimensions of the electronic device.

Third, various connectors described herein can facilitate robust and efficient manufacturing processes by facilitating flexibility in the assembly of various components within an electronic device.

Fourth, various connectors described herein can promote an aesthetically pleasing appearance of an electronic device by providing flexibility in positioning components of the electronic device. For example, various components may be positioned centrally and/or symmetrically within the electronic device.

The details of one or more embodiments are set forth in the accompanying drawings and the description below. Other features and advantages will be apparent from the description and drawings, and from the claims.

DESCRIPTION OF THE DRAWINGS

The details of one or more embodiments are set forth in the accompanying drawings and the description below, and wherein.

DETAILED DESCRIPTION OF ILLUSTRATIVE EMBODIMENTS

Figure 1:
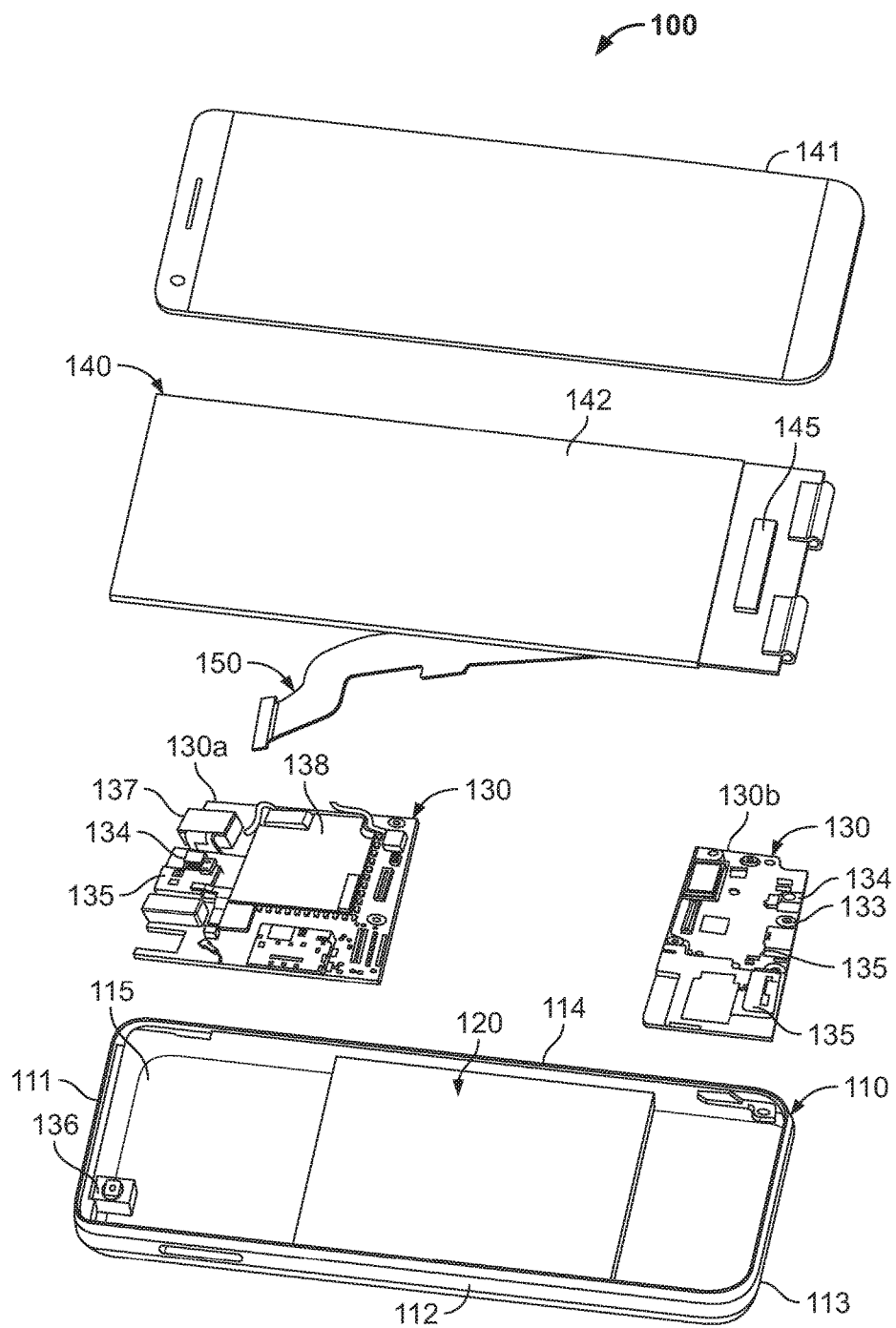
FIG. 1 is a perspective exploded view of an electronic device having a connector between a display assembly and a circuit board.
Figure 2:
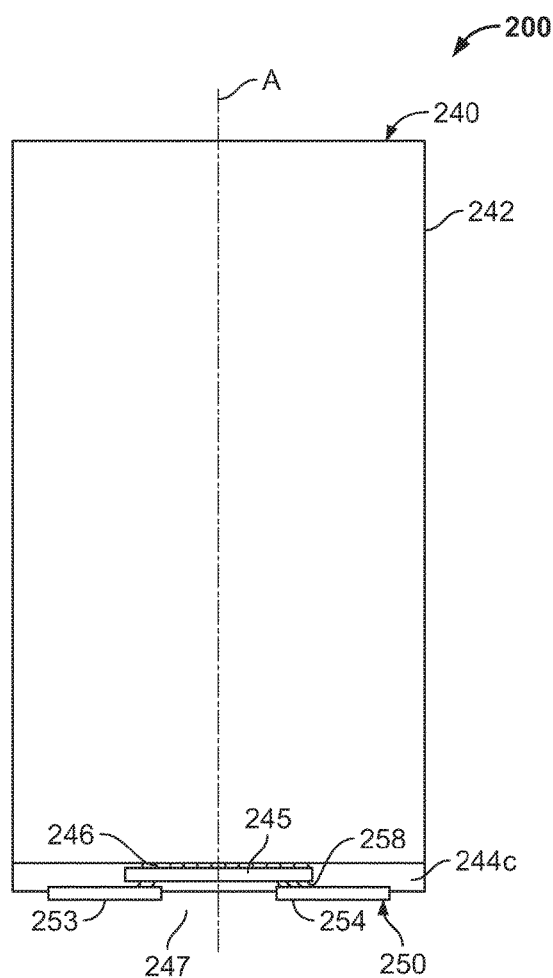
FIG. 2 is a front view of a display assembly.
Figure 3:
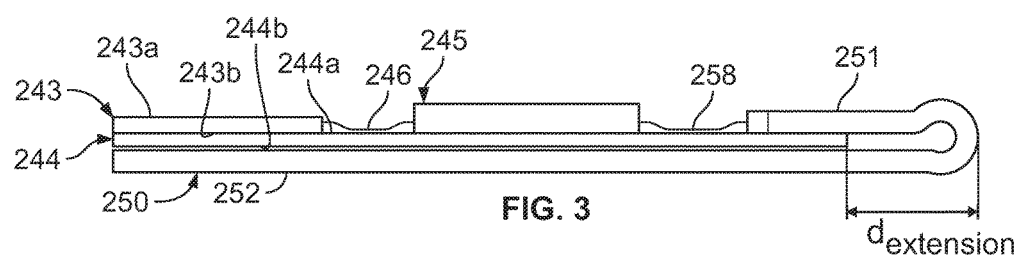
FIG. 3 is a partial side view of the display assembly of FIG. 2.
Figure 4:
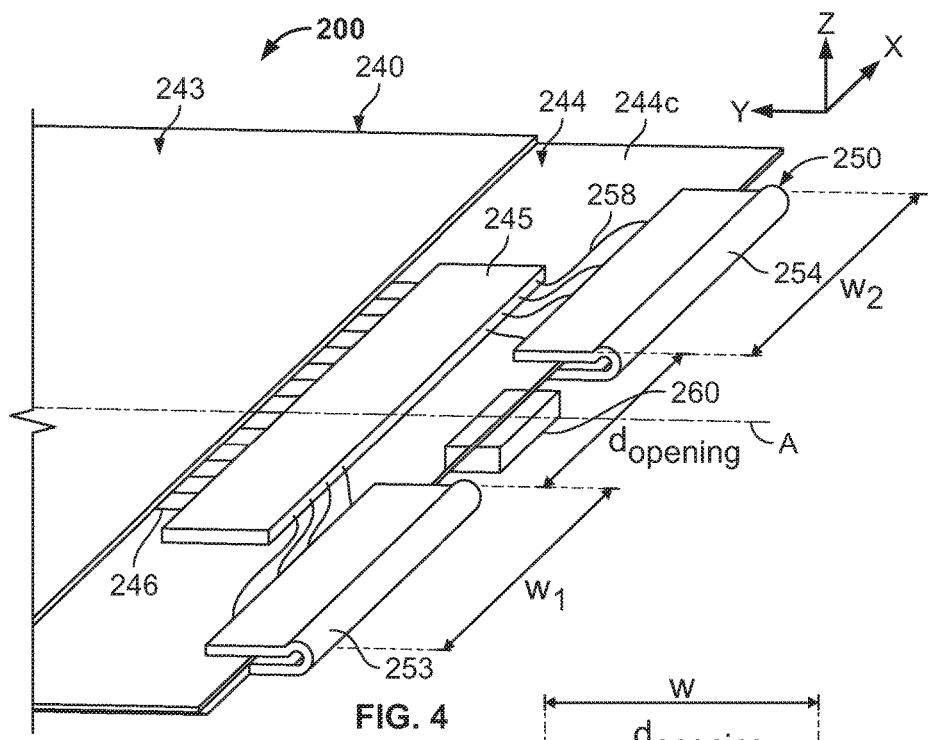
FIG. 4 is a front perspective view of the display assembly of FIG. 2.

Referring to FIG. 1, an example electronic device 100 is shown, including an electronic device housing 110, battery 120, circuit board 130 and a display assembly 140. A flex conductor 150 electrically connects display assembly 140 with circuit board 130 to provide transfer of data and power between display assembly 140 and circuit board 130. Flex conductor 150, and the connections between flex conductor 150, circuit board 130 and display assembly 140, are configured to reduce the amount of space required to accommodate these components within electronic device 100, and facilitate flexibility in the arrangement of other components within electronic device 100.

Electronic device housing 110 and an outer cover 141 define an interior volume that can house various components of electronic device 110, including battery 120, circuit board 130, and display assembly 140. Housing 110 can accommodate additional components of electronic device 100, such as microphone 133, speaker 134, sensors 135, such as fingerprint sensors, proximity sensors, accelerometers, and/or other sensors, camera assembly 136, flash devices 137, processor 138, and/or other components. In various embodiments, some or all of these components are electrically connected with circuit board 130.

Electronic device housing 110 provides a bucket-type enclosure having first, second, third, and fourth side portions 111, 112, 113, 114 that define outer sidewalls of electronic device 100, and a back major planar face 115 integrally formed with side portions 111, 112, 113, 114. A bucket-type enclosure allows components of electronic device 100 to be accommodated within housing 110 and enclosed by an outer cover, such as outer cover 141. In other embodiments, one or more side portions and/or back major planar face 115 may be formed separately and subsequently joined together (e.g., with one or more adhesives, welds, snap-fit connectors, fasteners, etc.). In various embodiments, electronic device housing 110 may be an H-beam type housing or other electronic device housing 110 that includes one or more walls that provide a housing to at least partially support and/or enclose components of electronic device 100.

Electronic device housing 110 is made from a material that provides adequate structural rigidity to support and protect internal components of electronic device 100. In an example embodiment, electronic device housing 110 is formed from a single piece of metal. Electronic device housing 110 may be milled, molded, forged, etched, printed, or otherwise formed. Alternatively or additionally, electronic device housing 110 may be formed from plastic, glass, wood, carbon fiber, ceramic, combinations thereof, and/or other materials.

Circuit board 130 is configured to accommodate components of electronic device 100 in a space-efficient manner, and provide robust mechanical and electrical connections between these components, such as one or more of microphone 133, speaker 134, sensors 135, camera assembly 136, flash devices 137, processor 138, and/or other components. In some embodiments, circuit board 130 includes a top circuit board 130a, and a bottom circuit board 130b, arranged at respective top and bottom end regions of electronic device 100, for example. Top and bottom circuit boards 130a, 130b are separately formed circuit boards and may be electrically connected by an electrical conductor. In other embodiments, top and bottom circuit boards 130a, 130b are integrally formed as a unitary circuit board (e.g., joined by a third circuit board extending between top and bottom circuit boards 130a, 130b).

Battery 120 may be positioned adjacent to top and/or bottom circuit boards 130a, 130b such that battery 120 is positioned substantially centrally between a top and bottom of electronic device 100 (e.g., between top and bottom sidewalls 111, 113). In other embodiments, battery 120 may be positioned in a stacked configuration such that circuit boards 130a and/or 130b are between battery 120 and display assembly 140 (e.g., sandwiched between battery 120 and display assembly 140), or vice versa.

Battery 120 provides a primary source of power for electronic device 100 and its components. Battery 120 may include a secondary cell, rechargeable battery configured for use through thousands of battery charging cycles over the entire useful life of electronic device 100, for example. In various embodiments, battery 120 may be a lithium polymer battery, lithium ion battery, nickel metal hydride battery, nickel cadmium battery, or other battery type configured to power electronic device 100 over many charging cycles. Alternatively or additionally, battery 120 may include a primary cell battery configured to be replaced when substantially discharged.

Display assembly 140 provides a user interface display that displays information to a user. For example, display assembly 140 may provide a touch screen display that a user can interact with to view displayed information and to provide input to electronic device 100. In an example embodiment, display assembly 140 occupies substantially all or the majority of a front major face of electronic device 100, and includes a rectangular visible display.

Display assembly 140 may include one or more substrate layers that provide the visible display and/or allow display assembly 140 to receive touch input from a user. For example, outer cover 141 may serve as an outermost layer that encloses other components of display assembly 140 and electronic device 100 and that a user may physically touch to provide input to electronic device 100. In some example embodiments, display assembly 140 includes a liquid crystal display (LCD) panel 142 including a liquid crystal material positioned between one or more color filter and thin-film-transistor (TFT) layers. The layers of display panel 142 may include substrates formed from glass or polymer, such as polyamide. In various embodiments, display assembly 140 may be a light-emitting diode (LED) display, an organic light-emitting diode (OLED) display, such as an active-matrix organic light-emitting diode (AMOLED) display, a plasma display, an electronic ink display, or other display that provides visual output to a user.

Display assembly 140 may include driver circuitry used to control display output and/or receive user input. In some embodiments, driver circuitry includes a display integrated circuit 145 that is mounted in electrical communication with the TFT layers of display panel 142, for example by gate lines or other electrical connection. Display integrated circuit 145 may receive display data from processor 138, for example, and deliver corresponding signals to control the optical properties of a liquid crystal layer, for example, to produce a display output.

Connection between display integrated circuit 145 and circuit board 130 (and particularly processor 138, for example) may be provided by an electrical conductor that facilitates a robust electrical connection while maintaining a space-efficient and low profile configuration that does not significantly increase the overall dimensions of electronic device 100. In an example embodiment, a flex conductor 150 connects display integrated circuit 145 and circuit board 130. Flex conductor 150 includes conductive structures on a thin, flexible substrate. Flex conductor 150 has a relatively thin profile and may be bent along a longitudinal direction to fit between various components of electronic device 100, such as to connect from a front face of a display substrate to circuit board 130 by passing between battery 120 and a rear of display assembly 140. Conductive structures of flex conductor 150 may include conductive lines, printed conductive traces, or other conductive components that provide electrical connection between respective electrical contacts associated with display integrated circuit 145 and circuit board 130. Flex conductor 150 may be a single, double, or multi-layer flexible printed circuit including a polyamide, PEEK, polyester, having printed or laminated conductive elements, for example. Such construction provides robust electrical characteristics that can provide reliable connection between various components while having a low bending radius that facilitates compact arrangement of flex conductor 150 within electronic device 100.

Components of display assembly 140 and flex conductor 150 may be positioned within electronic device 100 such that the space required to connect display assembly 140 with circuit board 130 is reduced. In some embodiments, display integrated circuit 145 may be positioned at a bottom of display substrate 142 (e.g., a bottom portion of display substrate 142 close to bottom wall 113) and flex conductor 150 wraps around a back side of display substrate 142 to connect with first and/or second circuit boards 130a, 130b. In some embodiments, display integrated circuit 145 may be positioned at a top of display substrate 142 (e.g., a portion of display substrate 142 close to top wall 111) and flex conductor 150 wraps around a back side of display substrate 142 to connect with first and/or second circuit boards 130a, 130b. In some embodiments, display integrated circuit 145 may be positioned along a side of display substrate 142 (e.g., a side portion of display substrate 142 close to sidewall 112 or sidewall 114) and flex conductor wraps around a back side of display substrate 142 to connect with first and/or second circuit boards 1301, 130b. In some embodiments, display integrated circuit 145 and flex conductor 150 are positioned so that flex conductor 150 does not extend between display assembly 140 and battery 120. Positioning the battery 120 directly adjacent display assembly 140 (e.g., without an intervening electrical conductor 150 passing between battery 120 and display assembly 140) facilitates an increased battery size having a greater power capacity.

Electronic device 100 may be an electronic device including a display assembly, such as a mobile phone, music player, tablet, laptop computing device, wearable electronic device, data storage device, display device, adapter device, desktop computer, or other electronic device.

Referring to FIGS. 2-5, an example display assembly 240 is shown. Display assembly 240 provides a display output and/or touch input for electronic device 200, and, in some embodiments, may have features similar to display assembly 140 described above with reference to electronic device 100. Display assembly 240 includes a display panel 242 that includes one or more substrate layers, a display integrated circuit 245, and a flex conductor 250 configured to electrically connect display assembly 240 with a circuit board (e.g., similar to circuit board 130, described above) or other component.

Display panel 242 includes a first display substrate 243 having front and back major surfaces 243a, 243b, and a second display substrate 244 having front and back major surfaces 244a, 244b. Display panel 242 may be an LCD, LED, OLED, AMOLED, plasma, electronic ink, or other display panel. In some embodiments, first display substrate 243 is a color filter layer and second substrate 244 is a TFT layer. A liquid crystal material may be positioned between first and second display substrates 243, 244. In some embodiments, first display substrate 243 may overlap entirely with second display substrate 244. Second display substrate 244 may be slightly larger than first display substrate 243 such that second display substrate 244 includes a bottom region 244c that is not covered by first display substrate 243. Alternatively or additionally, region 244c may be positioned at a top or side of display assembly 240.

Display integrated circuit 245 is electrically connected to at least a portion of first and/or second display substrates 243, 244. In some embodiments, display integrated circuit 245 may be mounted to, and electrically connected with, second display substrate 244 at bottom region 244c (e.g., in a chip-on-glass configuration). Data signal lines 246 provide communication between display integrated circuit 245, thin-film-transistors, and/or other circuit components mounted on second display substrate 244. In other embodiments, display integrated circuit 245 may be positioned at a top or side of display assembly 240.

Flex conductor 250 provides electrical connection between display integrated circuit 245 and a circuit board including a processor, for example. Flex conductor 250 has a display end portion 251, configured to provide electrical connection with display integrated circuit 245 (e.g., at region 244c at a bottom of display assembly 240, or at a top or side of display assembly 240 in configurations in which display integrated circuit 245 is positioned at a top or side of display assembly), and a circuit board end portion 252, configured to connect with a processor or circuit board stacked below display panel 242. Display end portion 251 includes first and second connectors 253, 254 spaced apart from one another, and circuit board end portion 252 includes a third connector 255. First and second connectors 253, 254 each include a plurality of electrical conductors in electrical communication with respective electrical conductors of display integrated circuit 245. In some embodiments, flex conductor 250 includes two connectors (e.g., first and second connectors 253, 254) connected to a single display integrated circuit 245.

Flex conductor 250 may be bent or flexed along a route between display panel 242 and a processor or circuit board. In some embodiments, flex conductor 250 makes an approximately 180° bend to connect between a front major face of display panel 242 and a processor or circuit board stacked behind display panel 242 (e.g., circuit board 130a or circuit board 130b). In such configurations, flex conductor 250 may be described as bent over itself such that portions of electrical conductor 250 overlap one another (e.g., near bottom region 244c as viewed in FIG. 3). Material properties of flex conductor 250, and particularly properties of the substrate and conductors of flex conductor 250, may require that flex conductor 250 extend a minimum distance beyond an end of display panel 242 (e.g., a minimum distance beyond bottom region 244c) and have a minimum radius of curvature at the location of the bend. In various embodiments, flex conductor extends a distance ($d_{extension}$) between about 0.2 mm and 3 mm, 0.6 mm and 1.5 mm, or about 1.0 mm beyond bottom region 244c of display substrate 244.

First and second connectors 253, 254 are spaced apart from one another such that flex conductor 250 does not occupy a central, longitudinal axis (A) of display panel 242 along the front face of substrate 244 at bottom region 244c, for example (e.g., the first and/or second connectors 253, 254 are not centrally located on display panel 242). In some embodiments, first and second connectors 253, 254 are symmetrical such that each have an equal width, equal number of conductors, and are equally spaced on opposite sides of the central, longitudinal axis. In other embodiments, first and second connectors may be non-symmetrical, and/or non-symmetrically arranged about the central, longitudinal axis (A). For example, first connector 253 may have a different width or arrangement of conductors as compared to second connector 254. Alternatively or additionally, first and second connectors 253, 254 may have non-symmetrical spacing relative to the central, longitudinal axis (A) such that first conductor 253 is closer to, and/or intersected by, the central, longitudinal axis (A) as compared to second connector 254, or vice versa.

First and second connectors 253 are joined to display assembly 240, and particularly display integrated circuit 245, by a robust and space-efficient connection. For example, first and second connectors 253 may be connected to display integrated circuit 245 by anisotropic conductor connections 258, such as by anisotropic conductive film (ACF) connections, anisotropic conductive paste (ACP) connections, other anisotropic conductive adhesives, and/or other connections.

Flex conductor 250 having two connectors 253, 254 electrically connected to display integrated circuit 245 facilitates a compact configuration that allows flexibility in positioning various electronic components of an electronic device. For example, one or more other components 260 may be positioned in the space 247 defined between first and second connectors 253, 254. Component 260 may be positioned substantially centered within the device (e.g., along the central, longitudinal axis (A)). In various embodiments, component 260 includes one or more of a microphone, speaker, sensor, such as fingerprint sensor, proximity sensor, accelerometer, or other sensor, camera assembly, flash device, processor, or other components. First and second connectors 253, 254 are spaced a fixed distance from one another to define space 247 in which component 260 can be nested.

Flex conductor 250 having first and second connectors 253, 254 spaced apart from each other facilitates an electronic device having a compact overall length. In some embodiments, an overall length of electronic device 200 may be equal to or only slightly longer than a visible display of display assembly 240. A compact overall length is facilitated by positioning component 260 adjacent to a portion of flex conductor 250 such that component 260 can be accommodated within electronic device 200 without independently adding to the length of electronic device 200 (e.g., without being positioned entirely beyond bent portions of electrical conductor 250). Component 260 may be positioned adjacent to a portion of flex conductor 250 such that component 260 is next to flex conductor 250 along the x-axis of display assembly 240. In such a configuration, the length of display assembly 240 can be reduced as compared to a configuration in which component 260 is arranged next to a portion of flex conductor 250 along the y-axis, and the thickness of display assembly 240 can be reduced as compared to a configuration in which component 260 is stacked above or below a portion of flex conductor 250 along the z-axis.

Flex conductor 250 having two connectors at display end portion 251 further facilitates an aesthetically pleasing appearance by allowing component 260 to be positioned substantially centrally along longitudinal axis (A) without unduly increasing the length of electronic device 200. A split end of flex conductor 250 such that first and second conductors are each spaced apart from central, longitudinal axis (A) creates a space 247 intersected by central, longitudinal axis (A). Component 260 may thus be positioned along central, longitudinal axis (A) housing in space 247 between first and second connectors 253, 254.

Component 260 may include a component of an electrical connector configured to connect with a component external to electronic device 200. For example, component 260 may be a connector receptacle having a shape configured to receive a complementary connector end of a cable that connects electronic device 200 to an external component for data and/or power transfer. Positioning component 260 in space 247 between first and second connectors 253, 254, may facilitate a connector having a small profile that can reduce the overall thickness of electronic device 200 and/or free space within electronic device 200 to house other components.

Connector receptacle 260 may be aligned with an opening in a housing of electronic device 200 (e.g., such as electronic device housing 110 described above) and may be integrally formed with the electronic device housing. For example, connector receptacle 260 may extend inwardly from an outer wall portion of the electronic device housing, and include walls formed integrally with the electronic device housing. A length of connector receptacle 260 extending inwardly from an outer wall portion of the electronic device housing may be greater than an overall thickness of electronic device 200, such as a thickness between a back major face and outer cover of electronic device 200.

Such a configuration can accommodate a connector receptacle in a space efficient manner that may reduce the overall size of electronic device 200. Positioning the connector receptacle 260 at least partially in space 247 between first and second connectors 253, 254 allows connector receptacle 260 to be positioned along central, longitudinal axis (A) without independently requiring an increased overall length of electronic device 200 along the y-axis. In some embodiments, the connector receptacle 260 is integrally formed with the electronic device housing and the overall thickness of electronic device housing 110 in the z-direction may be reduced.

Figure 5:
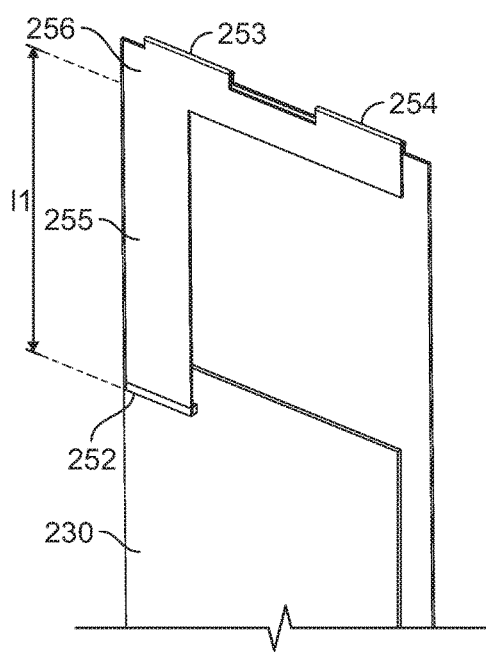
FIG. 5 is a rear perspective view of the display assembly of FIG. 2.

Referring to FIG. 5, flex conductor 250 may extend along back major surface 244b of substrate 244 between bottom region 244c and third connector 255 of circuit board connector portion 252. In some embodiments, flex conductor 250 extends proximate an edge of display assembly 240 to connect to circuit board 230. Alternatively or additionally, flex conductor 250 may extend at least partially along the central, longitudinal axis (A) to connect to circuit board 230. Circuit board 230 may be a top circuit board (e.g., positioned near a top of electronic device 200), a bottom circuit board (e.g., positioned near a bottom of electronic device 200, or positioned at an intermediate position within electronic device 200. Flex conductor 250 thus provides a thin electrical conductor that electrically connects display integrated circuit 245 and circuit board 230 in a space efficient and robust manner.

Figure 6:
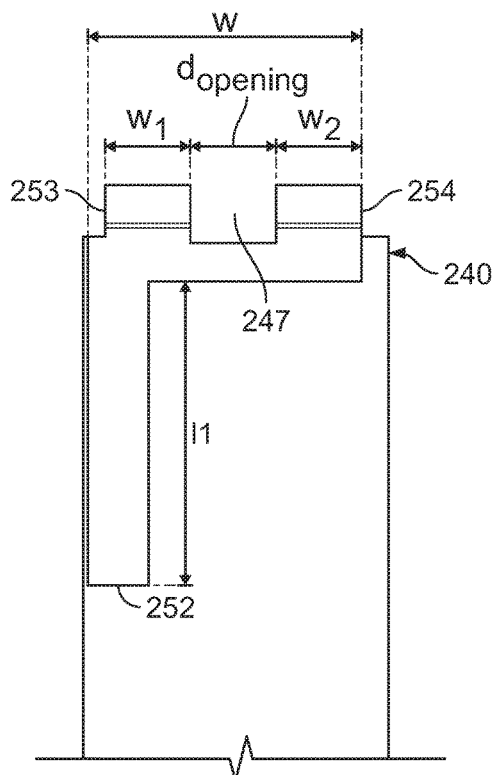
FIG. 6 is a rear view of the display assembly of FIG. 2 with first and second electrical connectors in an unconnected configuration.
Figure 7:
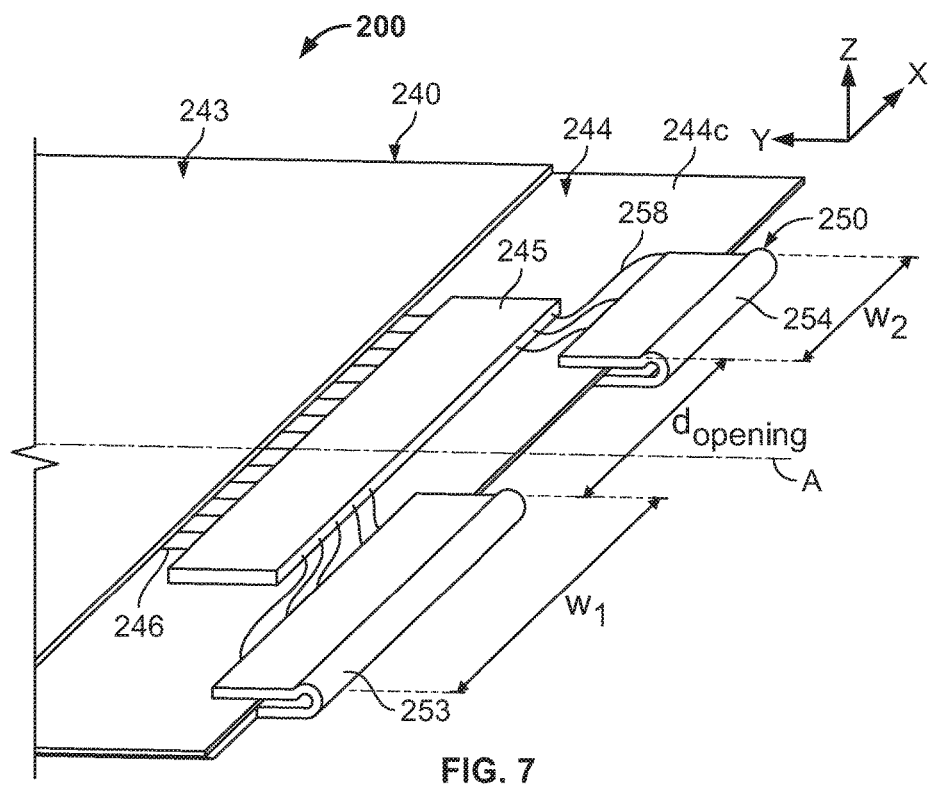
FIG. 7 is another display assembly having a connector between a display assembly and a circuit board.

Referring to FIG. 6, example flex conductor 250 is shown in a flattened configuration (e.g., in an unconnected configuration in which first and second connectors 253, 254 are not connected with display integrated circuit 245). First connector 253 has a width (w1) and second connector 254 has a width (w2). First and second widths (w1), (w2), may be selected to accommodate the desired number, size, and arrangement of electrical conductors within flex conductor 250 to electrically connect display integrated circuit 254, circuit board 230, and/or other components of electronic device 200. In some embodiments, first and second widths (w1), (w2) are substantially identical and may be positioned symmetrically about the central, longitudinal axis (A). Alternatively, first and second widths (w1), (w2) may be different. For example, first width (w1) of first connector 253 may be wider and/or accommodate more or different conductors as compared to second width (w2) of second connector 254, as shown in FIG. 7.

Space 247 between first and second connectors 253, 254 may be defined in part by a distance ($d_{opening}$) between edges of first and second connectors 253, 254. In some embodiments, display end portion 251 of flex conductor 250 has a width (W) including first and second connectors 253, 254, space 247, and/or one or more other portions of display end portion 251. In some embodiments, ($d_{opening}$) is between 0.1*width (W) and 0.9*width (W), 0.2*width (W) and 0.8*width (W), or about ⅓ of width (W). Such relative dimensions provide an adequate space 247 to accommodate one or more components 260 between first and second connectors 253, 254, while first and second connectors 253, 254 are sufficiently wide to accommodate desired electrical conductors.

Flex conductor 250 includes an intermediate portion 256 joining first and second connectors 253, 254. Intermediate portion 256 includes the electrical conductors of each of first and second connectors 253, 254, for example. Flex conductors of flex conductor 250 may be routed through a 90° turn between first and/or second connectors 253, 254, and/or between intermediate portion 256 and third connector 255. Third connector 255 may have an elongate configuration and extend a length (l1) between intermediate portion 256 and connection to a circuit board, such as circuit board 230, or other component of electronic device 200. In some embodiments, length (l1) is more than 50%, and in some embodiments more than 75%, of an overall length of flex conductor 250. Alternatively or additionally, length (l1) of third connector 255 may be greater than first width (w1), second width (w2), and/or the first and second widths (w1), (w2), combined. Such a relative length of third connector 255 may facilitate space-efficient routing of flex conductor 250 from bottom region 244c to circuit board 230. Alternatively or additionally, flex conductor may include one or more additional portions between first, second, and/or third connectors 253, 254, 257.

Figure 8:
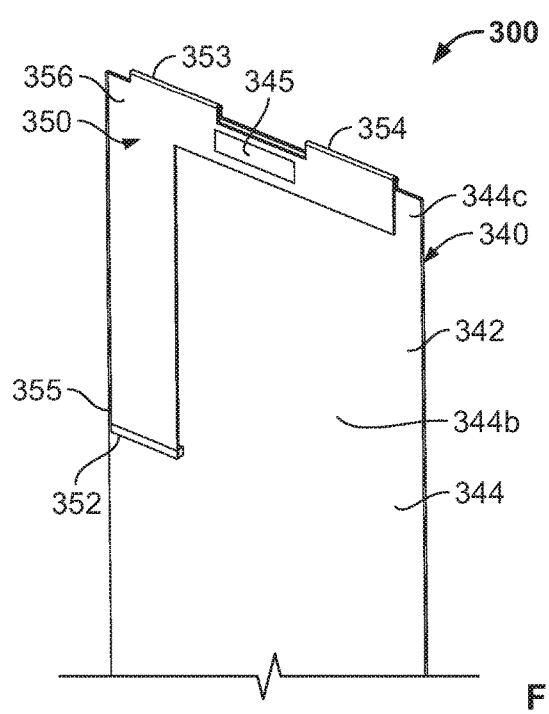
FIG. 8 is another display assembly having a display assembly integrated circuit on a rear of a display assembly component.

Referring to FIG. 8, another example electronic device 300 is shown including display assembly 340 and flex conductor 350. In some embodiments, electronic device 300 may include features similar to electronic devices 100 and 200 described above. Display assembly 340 provides a display output and/or touch input for an electronic device, and includes a display panel 342 having one or more substrate layers, a display integrated circuit 345. Flex conductor 350 is configured to electrically connect display integrated circuit 345 with a circuit board (e.g., similar to circuit board 130, described above) or other component.

Display panel 342 may include a first display substrate (not shown in FIG. 8) and a second display substrate 344 having front and back major surfaces 344a, 344b. Display panel 342 may be an LCD, LED, OLED, AMOLED, plasma, electronic ink, or other display panel. In some embodiments, the first display substrate is a color filter layer and second substrate 344 is a TFT layer. A liquid crystal material may be positioned between first and second display substrates. In some embodiments, the first display substrate may overlap entirely with second display substrate 344. Second display substrate 344 may be slightly larger than the first display substrate such that second display substrate 344 includes a bottom region 344c that is not covered by first display substrate 343.

Flex conductor 350 provides electrical connection between display integrated circuit 345 and a circuit board including a processor, for example. Flex conductor 350 has a display end portion 351, configured to connect to and/or wrap around bottom region 344c of display substrate 344. Display end portion 351 includes first and second connectors 353, 354 spaced apart from one another and circuit board end portion 352 includes a third connector 355. In some embodiments, flex conductor 350 is electrically connected to a single display integrated circuit 345 on the flex conductor, and flex conductor includes two connectors (e.g., first and second connectors 353, 354).

Display integrated circuit 345 is electrically connected to at least a portion of the first display substrate and/or second display substrate 344 (e.g., via flex conductor 350). In some embodiments, display integrated circuit 345 is mounted to, and electrically connected with, flex conductor 350 (e.g., in a chip-on-flex configuration). In some embodiments, display integrated circuit 345 is mounted to an intermediate portion 356 of flex conductor 350 between first and second connectors 353, 354 and third connector 355. Display integrated circuit may thus be positioned adjacent a face of display substrate 344 opposite the visible display of display panel 342. In the embodiment shown in FIG. 8, display integrated circuit 345 is positioned opposite the back major surface 344b of display substrate 344, and particularly opposite the back major surface 344b proximate bottom region 344c. Such a configuration may facilitate manufacturing and assembly of display assembly 340 and flex conductor 350 while providing a space efficient configuration that allows a reduced overall size of electronic device 300.

Figure 9:
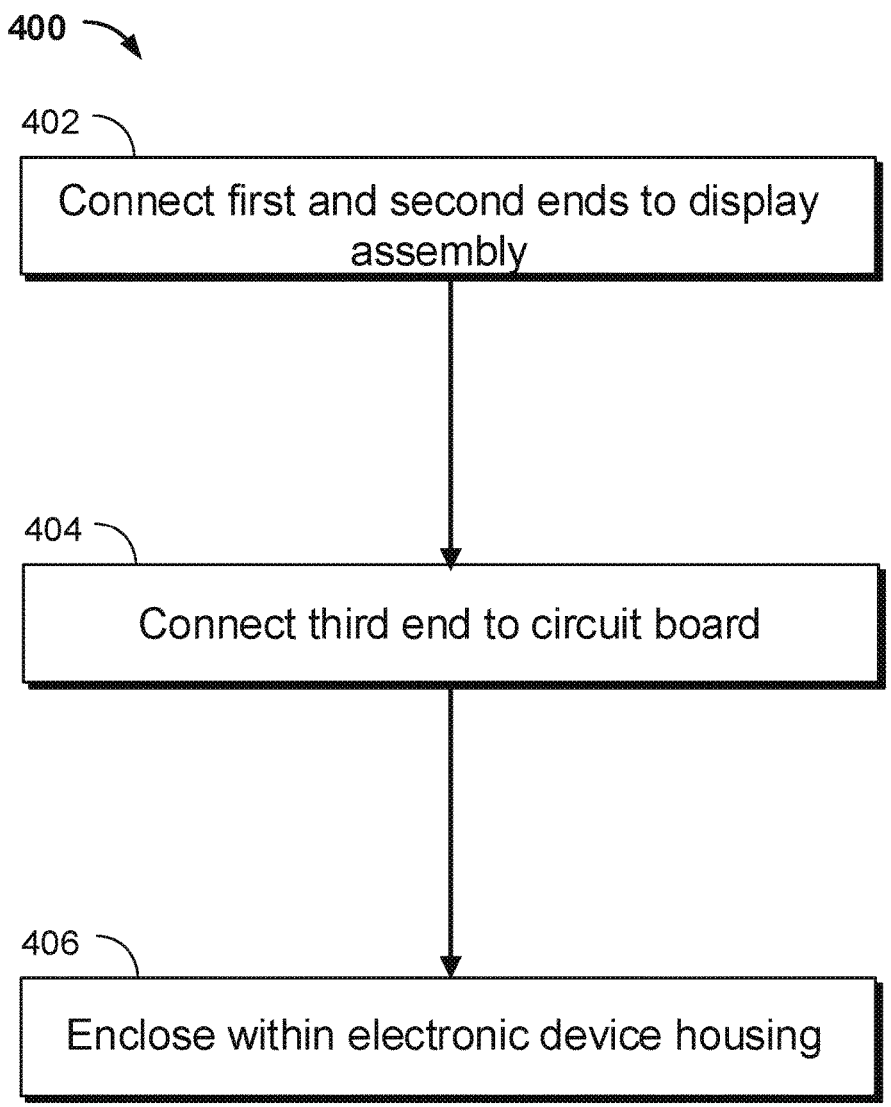
FIG. 9 is a flow diagram of a method of manufacturing an electronic device.

Some example flex connectors described herein facilitate efficient and reliable manufacturing techniques to provide a compact electronic device. Referring to FIG. 9, a flow diagram of an example method 400 of manufacturing an electronic device is shown. In some embodiments, method 400 includes operation 402 of connecting first and second connectors of a flex conductor with a display assembly. For example, the first and second connectors may be electrically connected with the display assembly, such as a display integrated circuit and/or display substrate. Operation 402 may include steps of electrically connecting the first and second connectors with the display integrated circuit and/or display substrate using anisotropic conductive connections.

Method 400 further includes operation 404 of connecting a third connector of the flex conductor with a circuit board. In some embodiments, the circuit board is positioned behind and parallel to a back major face of the display substrate. The flex substrate may be wrapped or bent around a bottom end or side of the display substrate to extend to the circuit board. In various embodiments, the circuit board may be a printed circuit board, flex circuit, or other circuit board.

Method 400 further includes operation 406 of enclosing flex conductor in an enclosure of an electronic device. In some embodiments, operation 406 includes positioning the circuit board, flex conductor, and at least a portion of the display substrate within a housing of the electronic device. The housing may be enclosed by an outer cover.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. A touch display system, comprising:
    a display substrate having a front major face and a back major face;
    a display integrated circuit mounted to the display substrate;
    a circuit board including a processor oriented behind the back major face of the display substrate; and
    a flex conductor electrically connected to the display integrated circuit and the circuit board, the flex conductor having:
        (i) a display connector end including a first connector and a second connector, the first connector and the second connector being separated by a distance defining a space where the flex conductor is not present, and
        (ii) a circuit board connector end including a third connector opposite from the display connector end,
    wherein the first connector and the second connector are connected to the display integrated circuit and the third connector is connected to the circuit board; and
    wherein an electrical component that is not directly electrically connected to the flex conductor is located between the first connector and the second connector.

2. The system of claim 1, wherein the display substrate defines a central, longitudinal axis passing parallel to the front and back major faces, and the central, longitudinal axis intersects the display integrated circuit.

3. The system of claim 2, wherein the central, longitudinal axis does not intersect the flex conductor at the connection with the display integrated circuit.

4. The system of claim 2, wherein the display integrated circuit is centered about the central, longitudinal axis.

5. The system of claim 4, wherein the first connector and the second connector are positioned symmetrically about the central, longitudinal axis.

6. A touch display system, comprising:
    a display substrate having a front major face and a back major face;
    a display integrated circuit mounted to the display substrate;
    a circuit board including a processor oriented behind the back major face of the display substrate; and
    a flex conductor electrically connected to the display integrated circuit and the circuit board, the flex conductor having:

(i) a display connector end including a first connector and a second connector, the first connector and the second connector being separated by a distance defining a space, and (ii) a circuit board connector end including a third connector opposite from the display connector end, wherein the first connector and the second connector are connected to the display integrated circuit and the third connector is connected to the circuit board;

wherein the display end of the flex conductor has a width (W), and the distance defining the space is between 0.2*width (W) and 0.8*width (W); and wherein an electrical component that is not directly electrically connected to the flex conductor is located between the first connector and the second connector.

7. A touch display system, comprising:
a display substrate having a front major face and a back major face;
a display integrated circuit mounted to the display substrate;
a circuit board including a processor oriented behind the back major face of the display substrate; and
a flex conductor electrically connected to the display integrated circuit and the circuit board, the flex conductor having:
(i) a display connector end including a first connector and a second connector, the first connector and the second connector being separated by a distance defining a space, and
(ii) a circuit board connector end including a third connector opposite from the display connector end,
wherein the first connector and the second connector are connected to the display integrated circuit and the third connector is connected to the circuit board;
wherein an electrical component that is not directly electrically connected to the flex conductor is located between the first connector and the second connector.

8. The system of claim 1, wherein a recessed connector receptacle configured to receive a connector of a cable that connects the electronic device to an external component is located in the space between the first connector and the second connector.

9. The system of claim 1, wherein a component selected from the group consisting of a microphone, speaker, sensors, fingerprint sensor, proximity sensor, accelerometer, camera, and flash device is located in the space between the first connector and the second connector.

10. The system of claim 1, wherein the display integrated circuit is mounted to the front major face of the display substrate and the flex conductor wraps around the display substrate from the front major face to the back major face.

11. The system of claim 1, wherein the circuit board is a printed circuit board.

12. The system of claim 1, wherein the circuit board is a flexible circuit.

13. A touch display system, comprising:
a display substrate having a front major face and a back major face;
a circuit board including a processor oriented behind and parallel to the back major face of the display substrate;
a flex conductor electrically connecting the display substrate and the circuit board, the flex conductor having a display end including a first connector and a second connector separated by a distance defining a space where the flex conductor is not present and a circuit board connector end including a third connector opposite from the display connector end; and
a display integrated circuit mounted on the flex conductor;
wherein the first and second connectors are electrically connected with the display substrate and the third connector is electrically connected with the circuit board; and
wherein an electrical component that is not directly electrically connected to the flex conductor is located between the first connector and the second connector.

14. The system of claim 13, wherein the display substrate defines a central, longitudinal axis passing parallel to the front and back major faces, and the central, longitudinal axis intersects the display integrated circuit.

15. The system of claim 14, wherein the central, longitudinal axis does not intersect the flex conductor at the connection with the display substrate.

16. The system of claim 13, wherein the display end of the flex conductor has a width (W), and the distance defining the space is between 0.2*width (W) and 0.6*width (W).

17. The system of claim 13, wherein a recessed connector receptacle configured to receive a connector of a cable that connects the electronic device to an external component is located between the first connector and the second connector.

18. A method of manufacturing a display assembly, comprising:
connecting a first connector and a second connector of a flex conductor to a display integrated circuit of a display assembly, the first and second connectors separated by a distance defining a space where the flex conductor is not present and positioned at an opposite end of the flex conductor from a third connector, wherein an electrical component that is not directly electrically connected to the flex conductor is located between the first connector and the second connector;
connecting the third connector to a circuit board; and
enclosing the flex conductor and circuit board within a housing of an electronic device.

* * * * *